US006687134B2

(12) United States Patent
Vinson et al.

(10) Patent No.: US 6,687,134 B2
(45) Date of Patent: Feb. 3, 2004

(54) CARD EXTRACTION AND SEPARATION SYSTEM

(75) Inventors: Wade D. Vinson, Magnolia, TX (US); Daniel T. Thompson, Houston, TX (US); Paul E. Westphall, Cypress Valley, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 50 days.

(21) Appl. No.: 10/170,730

(22) Filed: Jun. 13, 2002

(65) Prior Publication Data

US 2003/0231476 A1 Dec. 18, 2003

(51) Int. Cl.⁷ .............................. H05K 7/14; H05K 5/00
(52) U.S. Cl. ....................... 361/798; 361/796; 361/752; 361/754; 361/736; 211/41.17
(58) Field of Search ................................. 361/729, 730, 361/752, 754, 756, 796, 798; 211/41.17

(56) References Cited

U.S. PATENT DOCUMENTS

| | | | | |
|---|---|---|---|---|
| 5,383,793 A | * | 1/1995 | Hsu et al. ................... 439/327 |
| 5,829,601 A | * | 11/1998 | Yurchenco et al. ...... 211/41.17 |
| 5,892,658 A | * | 4/1999 | Urda et al. ................. 361/704 |
| 5,944,199 A | * | 8/1999 | Corisis et al. ............ 211/41.17 |
| 5,966,289 A | | 10/1999 | Hastings et al. ............ 361/704 |
| 6,031,733 A | * | 2/2000 | Corisis et al. ............... 361/825 |
| 6,058,011 A | | 5/2000 | Hardt et al. ................. 361/694 |
| 6,101,459 A | | 8/2000 | Tavallaei et al. ............ 702/132 |
| 6,151,215 A | * | 11/2000 | Hoffman ..................... 361/704 |
| 6,169,662 B1 | * | 1/2001 | Clark et al. ................. 361/754 |
| 6,185,093 B1 | * | 2/2001 | Moss .......................... 361/684 |
| 6,229,709 B1 | | 5/2001 | Hardt et al. ................. 361/753 |
| 6,381,149 B1 | | 4/2002 | Megason et al. ............ 361/801 |
| 6,396,703 B1 | * | 5/2002 | White ......................... 361/754 |
| 6,435,889 B1 | | 8/2002 | Vinson et al. .............. 439/247 |
| 6,437,992 B1 | * | 8/2002 | Carney et al. .............. 361/796 |
| 6,549,425 B1 | * | 4/2003 | Kosugi ....................... 361/809 |
| 6,621,708 B1 | * | 9/2003 | Sparkes et al. ............. 361/752 |

* cited by examiner

Primary Examiner—David Martin
Assistant Examiner—Dameon E. Levi (57) ABSTRACT

An apparatus for separating and extracting printed circuit boards in a computer system. More specifically, a basket assembly is provided through which a number of printed circuit boards may be attached to a motherboard. A card divider and extractor assembly including a card divider and card extractor is coupled to the basket assembly between each of the printed circuit boards. The card dividers provide structural and electrical isolation between the printed circuit boards. The card extractors provide a mechanism whereby printed circuit boards can be easily removed from the system while the system is operational.

44 Claims, 5 Drawing Sheets

CARD EXTRACTION AND SEPARATION SYSTEM

BACKGROUND OF THE INVENTION

1. Field of the Invention

This invention relates generally to computer systems and, more particularly, to a technique for separating and extracting printed circuit boards within a computer system.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Computer systems, such as personal computers and servers, rely on microprocessors, associated chipsets, and memory chips to perform most of their processing functions. Computer systems generally include one or more printed circuit board assemblies (PCBAs) including a system motherboard whereon microprocessors, memory chips and other useful devices may be mounted. Further, to provide modularity and increased functionality while advantageously occupying previously unused space in the computer system, additional PCBAs may be mounted and electrically coupled to the system motherboard. The additional PCBAs may be referred to as daughterboards, or "cards." Various components, such as memory devices, may be mounted on the cards to increase system performance. Each card may be electrically connected to the computer system and the other cards through electrical connections on the motherboard. Each card may include an edge having conductive fingers and being configured to be received by an edge connector on the motherboard. The plated fingers on the card removably engage the connector on the motherboard which also contains electrical contacts to electrically connect the card to other circuitry in the system and in other cards.

Conventionally, a motherboard may include a plurality of edge connectors arranged in parallel with each other and each configured to receive a card. Thus, when cards are inserted into the edge connectors on the motherboard, the cards may be positioned perpendicular to the motherboard and parallel to one another thereby forming a row of cards vertically mounted on the motherboard. Mounting cards in a computer system using edge connectors mounted on the motherboard allows cards to be inserted and/or removed relatively easily for repair, replacement or upgrades. Prior conventional systems generally required that the computer system be powered down before cards are added to or removed from the system. This practice generally prevents electrical shock to service technicians while replacing cards, as well as provides protection to the electrical components on the cards.

However, with the ever increasing capabilities of today's computer systems, systems and servers are often implemented to operate with little or no power down time. Systems often provide component redundancy such that components can fail without requiring that the system be powered down or losing system performance capabilities. With component redundancy, at least two components may be provided such that the system can perform the same function even if one of the components fails. In this case, operation is simply redirected to implement the redundant component. Thus, cards mounted on the motherboard may include redundant components such that if one of the cards fails, system performance is not degraded.

To fully utilize the capabilities of providing redundant components, the cards, including the various components in the computer system, may be hot-pluggable. Hot-pluggable cards can be inserted into and removed from the system while the system is "hot" or operating. Thus, if a card containing redundant components fails, the system will begin utilizing the redundant components on another card. Since it may be undesirable to power down the system, the faulty card can advantageously be removed and replaced while the system is operational. However, the close proximity of the cards means that components on the surfaces of the cards may be damaged during the insertion or removal process if they are scraped against adjacent cards. Still further, while the edge connectors on the motherboard and any other mechanism used to orient or stabilize the cards are configured such that the cards can be removed or inserted relatively easily, they must still provide enough structural integrity to support the cards. Since it may be advantageous to secure the cards within the edge connectors on the motherboard, some amount of force may be required for the user to extract the cards. Manually removing the card by manually gripping the edge of the card and applying an upward force sufficient to decouple the card from the motherboard increases the likelihood of system damage. Likewise, extracting the card using tools may increase the likelihood of damaging the adjacent boards.

Some systems implement a card assembly that may be fitted around a PCBA card to reduce the probability of physical damage to the inserted and surrounding cards. However, such card assemblies generally require that each card be fitted with the assembly, thereby increasing cost and complicating manufacturability.

The present invention may be directed to one or more of the problems set forth above.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
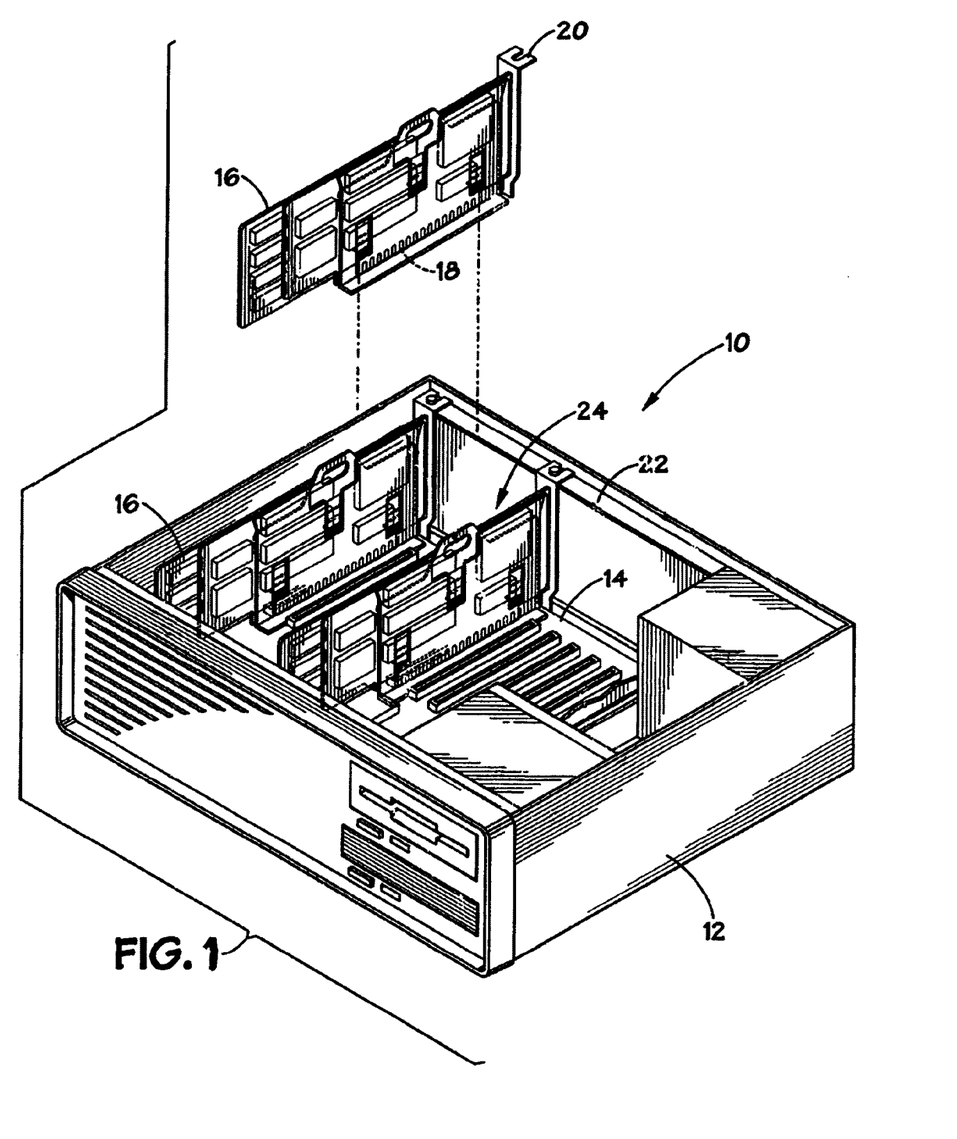
FIG. 1 illustrates a perspective view of a computer system in accordance with the present techniques.

Turning now to the drawings and referring initially to FIG. 1, a perspective view of a computer system is generally illustrated as reference numeral 10. The computer system 10 may include a user interface (not shown), such as a keyboard, a mouse, light pen, buttons or voice recognition system. The system 10 may also include a display (not shown) such as an LCD display, a CRT, LEDs and/or audio display. The computer system 10 includes a chassis 12 to house the processors, memory devices, expansion cards, disk drives, etc. which may be included in the system 10. As can be appreciated by those skilled in the art, a system circuit board or "motherboard" (not shown) is generally mounted to the floor of the chassis 12. The view of the motherboard in the presently described system is obstructed by the floor of the card basket assembly 14, which will be described with reference to FIGS. 2–5. The motherboard may include one or more processors, memory chips and associated devices, as well as one or more connectors to provide mechanical and electrical connections for one or more printed circuit boards ("daughter boards" or "cards"). The daughter boards may provide additional processing and memory capabilities for the system 10, for example. An exemplary daughter board 16 (along with the card divider and card extractor assembly explained further below) is shown in the exploded view of FIG. 1 and further illustrated with reference to FIGS. 2 and 3.

The daughter board 16 may be vertically coupled to the system motherboard. Card connectors on the motherboard (mounted in the base of the chassis) are adapted to mateably receive a plurality of respective edge connectors 18 which extend along the edge of the daughter board 16. Each of the edge connectors 18 includes a number of metal contacts or "fingers" which extend along the edge connector 18 to provide electrically conductive contact points such that electrical signals may be exchanged between the daughter board 16 and the motherboard. Each of the contact fingers may be gold plated, for instance. The edge connectors 18 are configured such that they may be removably engaged with the connectors on the motherboard.

While the edge connectors 18 generally provide both electrical and mechanical connection to the motherboard, it is generally advantageous to provide the daughter board 16 with further structural support within the chassis 12 to ensure that the daughter board 16 is mechanically secured within the system 10. To provide further support and mitigate the possibility of misalignment or misdirection of the daughter board 16 during insertion and/or removal of the daughter board 16 into the system 10, a card bracket 20 may be mounted on each daughter board 16 such that the card bracket 20 slideably engages a rail 22 in the chassis 12. The card bracket 20 may include a latch to lock the daughter board 16 into the system 10. In an alternate embodiment, the opposing side of the daughter board 16 may also include a card guide to provide further stability and support. In yet another embodiment, the daughter board 16 may be configured such that the edges of the printed circuit board are configured to slideably engage the rail 22 in the chassis 12, whereby the edge(s) of the daughter board 16 serve as the mechanism to guide the card into the rail 22.

As previously discussed, separation of the daughter boards 16 and ease of insertion and removal of the daughter boards 16 becomes more critical when the system is configured such that daughter boards 16 can be replaced while the system is operational or "hot." Misalignment of the daughter board 16 during insertion and/or removal into the system 100 while the system is hot can cause inadvertent contact of the conductive fingers on the edge connectors 18 with the conductive regions of the adjacent boards (not shown) or other conductive elements in the system 10, resulting in electrical shorts. Electrical shorts may damage both the daughter board 16 and other components/cards in the system 10. In some instances, a short can cause a computer to power-down, thereby providing a potential for data loss. Further, the daughter board 16, as well as other components and adjacent cards, may be physically damaged by mechanical forces if the daughter board 16 is inadvertently scraped against other components and/or adjacent cards during insertion or removal. This may also be true when the system 10 is non-operational or operational but not hot pluggable.

One of the functions of the basket assembly 14 is to provide protection to the motherboard which is housed in the chassis 12 beneath the basket assembly 14. The basket assembly 14 will be described further with reference to FIG. 2. To provide protection to the daughter boards 16, including a daughter board 16 being inserted into (or removed from) the system 10 and the adjacent daughter boards (not shown), a card divider and extractor assembly 24 may be provided between each daughter board 16. The card divider and extractor assembly 24 includes a card divider element and a card extractor element which are better illustrated and further described with reference to FIGS. 2–6 below.

Figure 2:
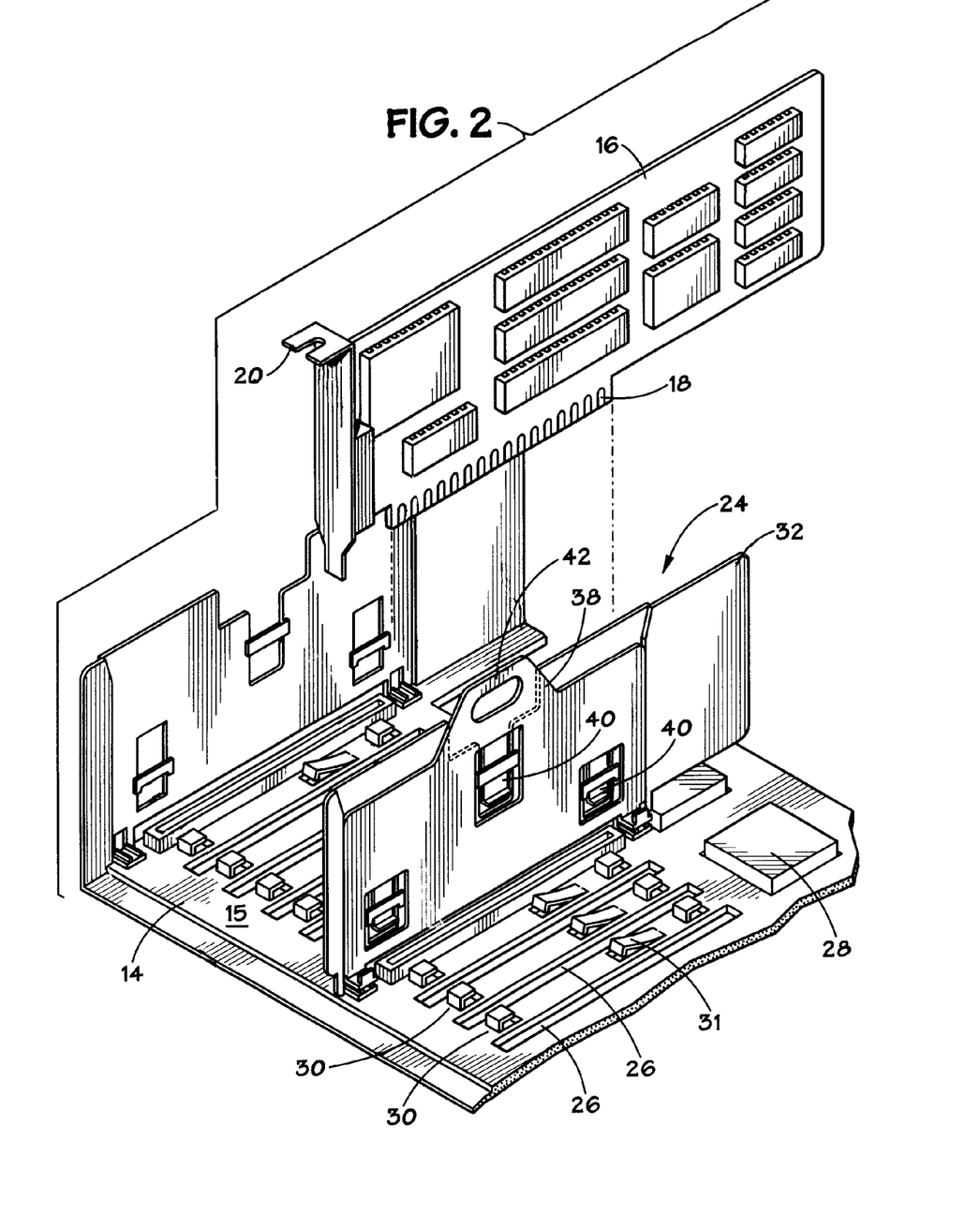
FIG. 2 illustrates a perspective view of a basket assembly in accordance with the present techniques.

FIG. 2 illustrates a more detailed perspective view of the basket assembly 14, a daughter board 16 and a card divider and extractor assembly 24. The basket assembly 14 includes a floor 15 which provides a protective surface over the motherboard. The floor 15 of the basket assembly 14 includes a number of slots 26 through which connectors on the motherboard may protrude to receive the edge connectors 18 of a coincident number of daughter boards 16. The present exemplary system 10 (FIG. 1) may be configured to accept up to eight daughter boards 16. Accordingly, the basket assembly 14 includes eight slots 26 to facilitate the coupling of up to eight daughter boards 16 in the system 10. The system 10 and basket assembly 14 may be configured to accept any number of desirable daughter boards 16. Further, the floor 15 of the basket assembly 14 may include additional slots or cutouts to accommodate other system/motherboard components, such as the exemplary chip 28 which may protrude from the surface of the system/motherboard housed below the basket assembly 14. The chip 28 is not part of the basket assembly 14 and is included, despite the absence of the motherboard below, for purposes of illustration.

In one embodiment of the basket assembly 14, the basket assembly 14 is configured such that the motherboard may be fully populated with electrical components without being restricted by the basket assembly 14. The basket assembly 14 is thus configured to be placed over the motherboard, without requiring any redesign or reconfiguration of the motherboard. The basket assembly 14 may be attached to the chassis 12 using a minimal number (preferably two) of attachment points. For example, the floor 15 may include two holes in diagonally adjacent corners such that the assembly basket 14 may be coupled to the chassis 12 via two screws or clipping mechanisms. The floor 15 of the basket assembly 14 is rigid enough to provide structural support and stability during shipment of the system 10.

The basket assembly 14 further includes a number of clipping assemblies 30 to attach a card divider and extractor assembly 24 between each of the slots 26. Each clipping assembly 30 may include any desirable mechanism for attaching the card divider and extractor assembly 24 to the basket assembly 14. In the present embodiment, each clipping assembly 30 is configured to slideably engage a securing shelf on the card divider 32 through slots in the securing shelf of the card divider 32. The card divider 32 and securing shelf are further discussed and illustrated with reference to FIG. 5 below. The clipping assembly 30 includes a locking clip 31 to lock the card divider and extractor assembly 24 onto the basket assembly 14. The clipping assembly 30 may include any one of a number of designs, as can be appreciated by those skilled in the art.

As previously described, the daughter board 16 may include a card bracket 20 to securably attach the daughter board 16 to the chassis 12 (FIG. 1) via the rail 22. The card bracket 20 may be latchable to the rail 22. As can be appreciated, the daughter boards 16 are mounted vertically with respect to the motherboard and floor 15 and are placed in parallel with respect to adjacent daughter boards 16.

As previously described, a card divider and extractor assembly 24 is coupled to the basket assembly 14 between each slot 26 and respective daughter board 16. The card divider and extractor assembly 24 comprises a card divider 32 and a card extractor 38. The card divider 32 provides physical separation between adjacent daughter boards 16 to mitigate potential injury or system damage during insertion/removal of the daughter boards 16. The card dividers 32 are vertically coupled to the floor 15 of the assembly basket 14 by the clipping assemblies 30. Advantageously, the card dividers 32 are of adequate length and height to completely separate one surface of a daughter board 16 from the surface of an adjacent daughter board 16. The card divider 32 is further discussed with reference to FIGS. 3–6 below.

The card extractor 38 is coupled to the card divider 32 (thereby forming the card divider and extractor assembly 24) to facilitate the extraction or removal of a daughter board 16 from the system 10. The surface of the card extractor 38 may be snapped to the surface of the card divider 32 such that the card extractor 38 is free to slide vertically along the surface of the card divider 32 during extraction of the daughter board 16 from the system 10. The card extractor 38 is coupled to the card divider 32 by one or more sliding snaps 40 which allow the card extractor 38 to slide along the surface of the card divider 32. The card extractor 38 is coupled to the card divider 32 such that the card extractor is perpendicular to the motherboard and floor 15, as with the card divider 32. Any number of snap designs may be used to provide a slideable connection between the card divider 32 and the card extractor 38, as can be appreciated by those skilled in the art. The card extractor 38 also includes a gripping portion 42 configured to be grasped by a service technician (or the like) and pulled in a vertical direction with respect to the motherboard to facilitate the sliding of the card extractor 38 along the card divider 32 in the direction of the pulling force (i.e. vertical to and away from the surface of the motherboard). The sliding of the card extractor 38 facilitates the extraction of the daughter board 16 from the system 10 as discussed further with respect to FIGS. 3, 4 and 6 below.

Figure 3:
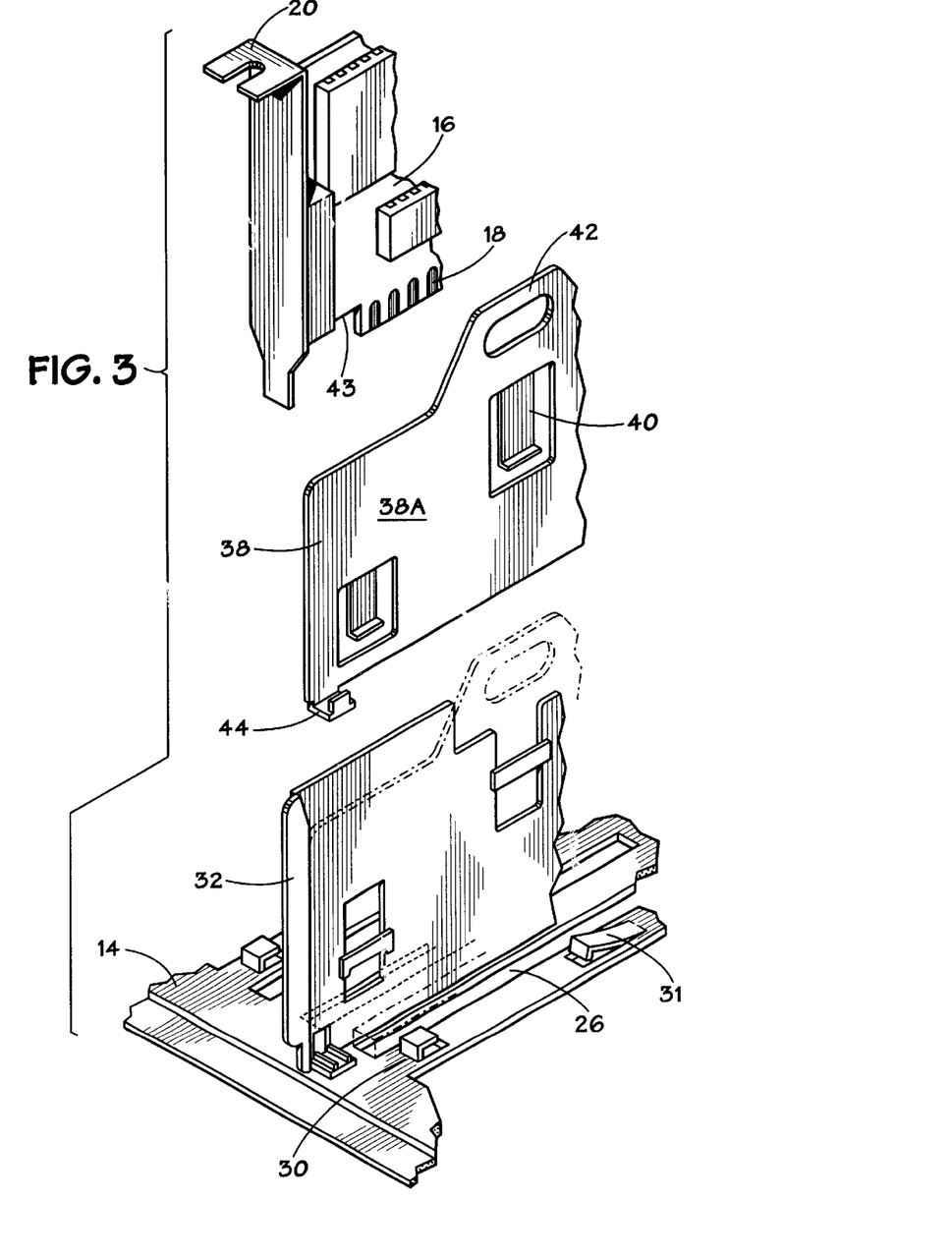
FIG. 3 illustrates an exploded perspective view of a partial circuit board assembly, card divider and card extractor in accordance with the present techniques.

FIG. 3 illustrates a partial exploded view of the daughter board 16, card extractor 38, card divider 32 and basket assembly 14. The card extractor 38 includes a lip portion 44 on each end and extends perpendicular to the front surface 38A of the card extractor 38. The lip portion 44 is configured such that when the edge connector 18 is inserted into the system 10, the edge 43 of the daughter board 16 rests on the lip portion 44 of the card extractor 38. Advantageously, when the daughter board 16 is coupled to the motherboard, the lip portion 44 is positioned on either side of the connector 18 so as to facilitate the even extraction of the daughter board 16 upon the upward pulling of the gripping portion 42. Accordingly, by pulling upward on the gripping portion 42 of the card extractor 38, the daughter board 16 is likewise lifted upward thereby decoupling the edge connector 18 from the system 10.

The gripping portion 42 of the card extractor 38 is essentially within the same thickness as the card extractor 38 (disregarding the lip portion 44). By providing a gripping portion 42 that is essentially within the same thickness as the card extractor 38 and configuring it such that it does not overhang any portion of the daughter board 16 at anytime during the insertion/removal process or system operation, damage to the daughter board 16 may be further mitigated by reducing the potential for scraping the daughter board 16 against the gripping portion 42 during insertion or extraction of the daughter board 16. Further, the gripping portion 42 is advantageously configured to facilitate the decoupling of a daughter board 16 from the motherboard using only one or two fingers. Once the connector 18 is decoupled from the motherboard using the card extractor 38, the board can be grasped and easily lifted out of the chassis 12 by a service technician. As previously described, the card divider 32 provides protection against further card damage due to scraping or electrical shorting.

As previously described, one notable feature of the card divider and extractor assembly 24 is that it comprises two separate pieces (i.e. the card divider 32 and the card extractor 38). Since the card divider 32 is a separate piece, it remains fixed with respect to the daughter board 16 during the insertion and removal process. By providing a fixed piece of material (i.e. the card divider 32) that does not move in the direction of card extraction (i.e. perpendicular to and away from the motherboard), the system 10 is more structurally stable and less likely to experience misalignment or accidental decoupling of daughter boards 16. By having two separate interlocking pieces, the present assembly provides an added robustness beyond that of prior systems. Advantageously, the only vertical movement (with respect to the floor 15) during extraction of a daughter board 16 is by the card extractor 38. As previously described, the card extractor 38 slides along the surface of the card divider 32 in an upward direction with respect to the motherboard. The lip portion 44 of the card extractor 38 ensures that the daughter board 16 is lifted along with the card extractor 38, thereby decoupling the daughter board 16 from the system 10 for removal and/or replacement.

Figure 4:
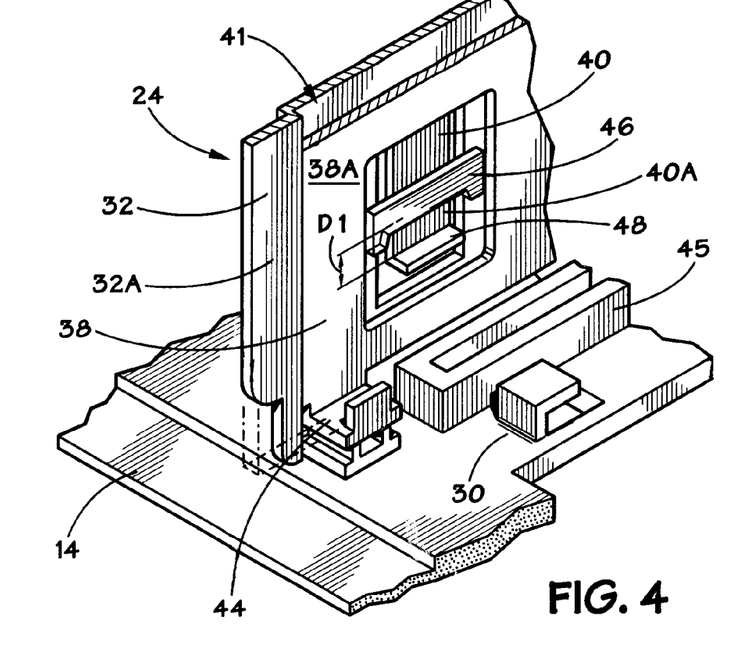
FIG. 4 illustrates an expanded perspective view of the frontside of the card divider and extractor assembly in accordance with the present techniques.

FIG. 4 illustrates an expanded perspective view of the frontside of the card divider and extractor assembly 24. The card divider and extractor assembly 24 is illustrated in the insertion position, wherein the card extractor 38 is positioned as it would be during normal system operation when a daughter board 16 (not shown in FIG. 4) is coupled to a connector on the motherboard. An exemplary connector 45 configured to receive an edge connector 18 (FIGS. 1–3) is illustrated as it would extend through the slot 26 (FIG. 2) in the basket assembly 14. As will be illustrated more fully with reference to FIGS. 5 and 6, the card divider 32 includes a recessed portion 41 that is configured to receive the card extractor 38. By providing a recessed portion 41 in which the card extractor 38 may be disposed, the overall thickness of the card divider and extractor assembly 24 may be advantageously reduced. Further, the edges of the recessed portion 41 provide a guide for the card extractor 38 during the process of decoupling a respective daughter board 16 from the system. In one exemplary embodiment, the front surface 38A of the card extractor 38 (i.e. the surface directly adjacent to the respective daughter board 16) may be flush with the front surface 32A of the card divider 32. In an alternate embodiment, the front surface 38A of the card extractor 38 may extend slightly (1–50 mils from the front surface 32A of the card divider 32.

The sliding snap 40 on the card extractor 38 is configured such that it pulls the card extractor 38 into contact with a stop bar 46 on the card divider 32. The front surface 40A of the sliding snap 40 is brought in contact with the backside of a stop bar 46 such that the back surface (not shown) of the card extractor is forced into contact with the front surface (not shown) of the recessed portion 41. The sliding snap 40 includes a stopper portion 48 that is configured to stop the movement of the card extractor 38 with respect to the card divider 32, once the daughter board 16 has been decoupled from the system 10. The stopper portion 48 extends perpendicular to the front surface 40A of the sliding snap 40 and is configured to catch on the stop bar 46 on the card divider 32 once the card extractor 38 has fully decoupled the daughter board 16 from the system 10. Accordingly, the distance D1 that the card extractor 38 may slide with respect to the card divider 32 may be slightly more than the height of the edge connector 18. The distance D1 is further illustrated with reference to FIGS. 6A and 6B below.

As further illustrated with reference to FIG. 4, the lip portion 44 of the card extractor 38 extends away from the front surface 38A of the card extractor 38 and is coincident with the connector 45 on the motherboard. If a daughter board 16 was illustrated in FIG. 4, the daughter board 16 would be positioned such that the edge of the daughter board was resting on the lip portion 44 of the card extractor 38 while the edge connector 18 is inserted into the connector 45. When the gripping portion 42 (FIGS. 2 and 3) is pulled in a direction away from the planar surface of the motherboard, the card extractor 38 slides upward until the stopper portion 48 on the card extractor 38 is impeded by the stop bar 46 on the card divider 32. The lip portion 44 of the card extractor lifts the daughter board 16 from its coupled position thereby decoupling it from the connector 45 and the system 10.

Figure 5:
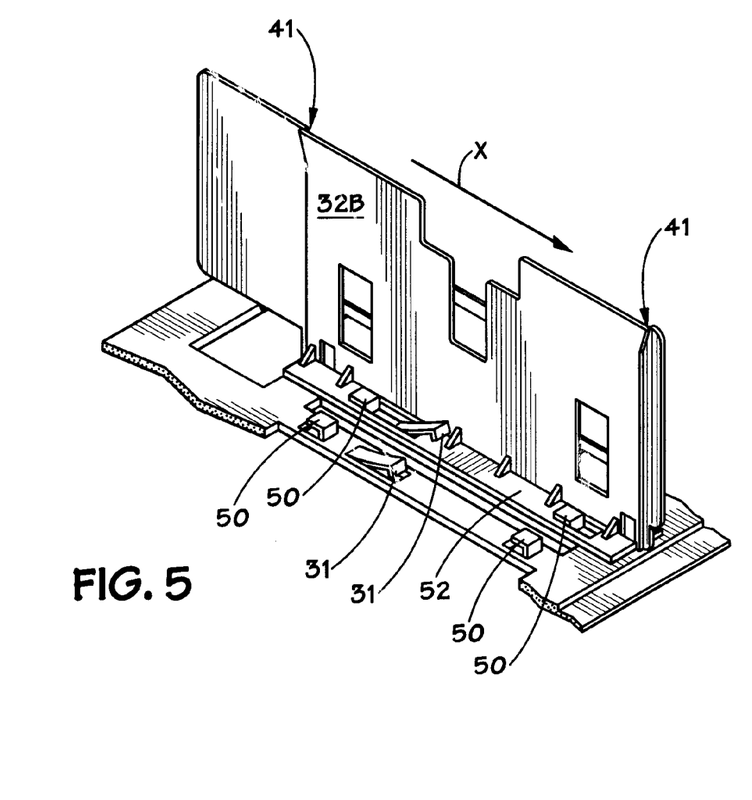
FIG. 5 illustrates a perspective view of the backside of the card divider and basket assembly in accordance with the present techniques.

FIG. 5 illustrates the backside surface 32B of the card divider 32. As previously described, the card divider 32 may be coupled to the basket assembly 14 by any number of techniques. In the present embodiment, each clip assembly 30 includes a snap 31 and two hooks 50. The hooks 50 are configured to be inserted through slots in the securing shelf 52 of the card divider 32. The hooks 50 are inserted through the slots, and the card divider 32 is slid in a direction X until the hooks 50 impede the movement of the card divider 32 in the X direction. The snap 31 is configured to pivotally recess into a corresponding slot in the basket assembly 14 during attachment of the card divider 32 to the basket assembly 14. Once the card divider 32 is slid in the X direction, one end of the snap 31 shifts through the corresponding slot in the basket assembly 14 and a corresponding slot in the securing shelf 52, thereby providing a mechanism whereby the card divider 32 is securely attached to the basket assembly 14, as can be appreciated by those skilled in the art.

Figure 6A:
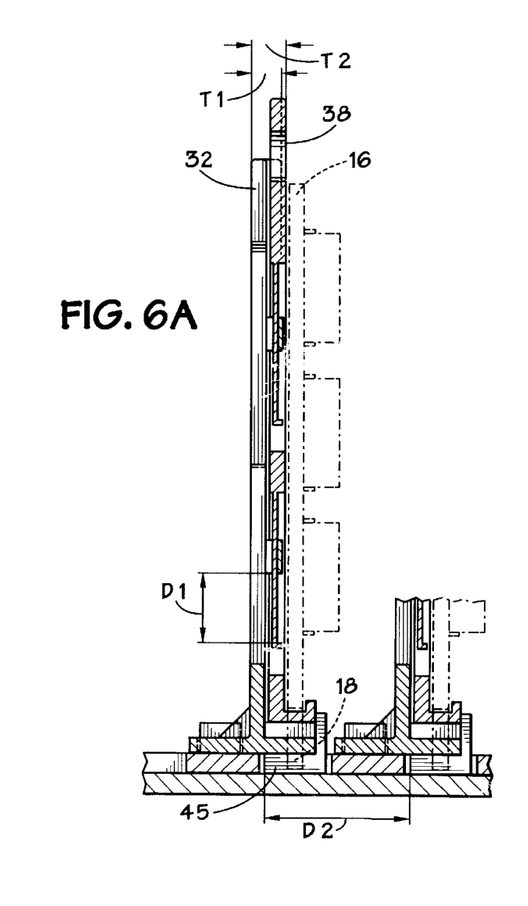
FIGS. 6A and 6B illustrate partial cross sectional views of the basket assembly, daughter boards, and card divider and extractor assemblies in an engaged and disengaged position in accordance with the present techniques.
Figure 6B:
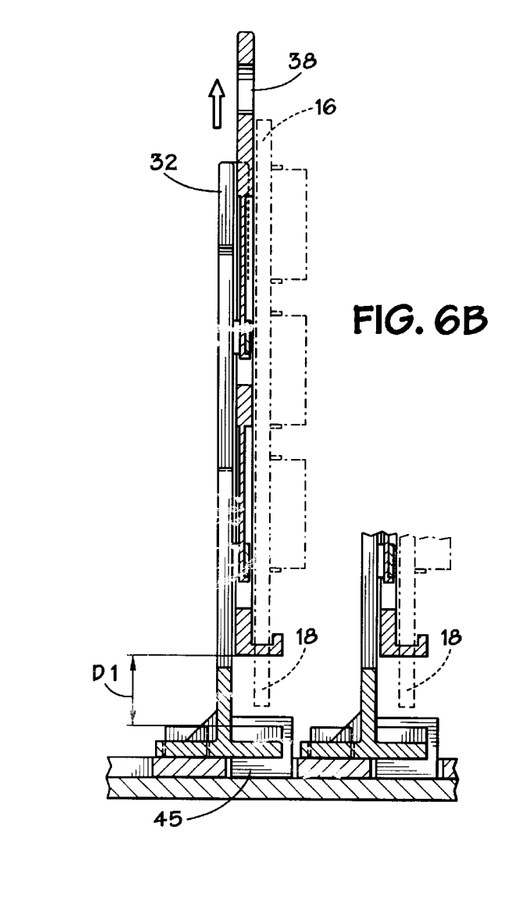

FIGS. 6A and 6B illustrate a partial cross-sectional view of the basket assembly 14, daughter board 16, card divider 32 and card extractor 38. FIG. 6A illustrates the daughter board 16 and the card extractor 38 in the engaged or operational position wherein the edge connector 18 is coupled to the connector 45 on the motherboard. FIG. 6B illustrates the daughter board 16 and the card extractor 38 in the disengaged position wherein the edge connector 18 is decoupled from the connector 45. As previously described, the distance D1 is large enough to allow the connector 16 to disengage from the connector 45.

While component dimensions and spacing may vary between systems, it is often desirable to minimize component size, including thickness, to reduce the area used and thereby provide more space for additional components. Exemplary design dimensions are provided herein which are compliant with Intel's PC100 specification. The distance D2 between each card divider 32 (and therefore between each daughter board 16) is advantageously between 780 mils and 920 mils. In one embodiment, the distance D2 between each card divider 32 may be 900 mils +/−10 mils (or between 890 mils and 910 mils). Further, the thickness T1 of the card divider from the backside surface of the recessed area to the front surface of the non-recessed area may be advantageously less than 110 mils and more advantageously less than or equal to 100 mils. Still further, the thickness T2 of the card divider and extractor assembly 24 from the front surface 38A of the card extractor 38 to the back surface 32B of the recessed area of the card divider 32 is advantageously less than 125 mils and more advantageously less than or equal to 100 mils. To minimize the space taken up by the card divider and extractor assembly 24, one embodiment of the card divider 32 includes a recessed portion 41 wherein the card extractor 38 is disposed, as previously described. This embodiment eliminates the need for increased thickness beyond the thickness already present in the card divider 32 alone. The thicknesses T1 and T2 and distances D1 and D2 are provided by way of example.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A computer system comprising:

a motherboard having a plurality of connectors;

a plurality of daughter boards each coupled to the motherboard through one of the respective connectors;

a basket assembly positioned above the motherboard and comprising a rigid floor, wherein the basket assembly does not impede component population of the motherboard;

a plurality of dividers coupled to the basket assembly and each arranged adjacent to at least one of the plurality daughter boards; and a plurality of card extractors, each coupled to a respective divider and configured to decouple a respective daughter board from the motherboard and wherein each of the plurality of card extractors comprises:

a gripping portion configured to be pulled to facilitate the decoupling of the daughter board from the motherboard; and a lip portion extending from the surface of the card extractor and arranged below an edge of the respective daughter board such that when the gripping portion is pulled, the daughter board is lifted from the respective connector on the motherboard.

2. The computer system, as set forth in claim 1, wherein each of the plurality of daughter boards is coupled to the motherboard in a direction perpendicular to the motherboard.

3. The computer system, as set forth in claim 1, wherein each of the plurality of dividers is coupled to the basket assembly in a direction that is perpendicular to the floor of the basket assembly and parallel to the surfaces of the plurality of daughter boards.

4. The computer system, as set forth in claim 1, wherein each of the plurality of daughter boards is separated from the next of the plurality of daughter boards by one of the respective dividers.

5. The computer system, as set forth in claim 1, wherein each of the plurality of daughter boards is hot-pluggable.

6. The computer system, as set forth in claim 1, wherein the distance between each of the plurality of dividers is in the range of 890 mils–910 mils.

7. The computer system, as set forth in claim 1, wherein the distance between each of the plurality of dividers is in the range of 780 mils–1020 mils.

8. The computer system, as set forth in claim 1, wherein the thickness of each of the plurality of dividers is less than 110 mils.

9. The computer system, as set forth in claim 1, wherein the thickness of each of the plurality of dividers is less than or equal to 100 mils.

10. The computer system, as set forth in claim 1, wherein the combined thickness of each of the plurality of card extractors and the respective one of the plurality of dividers is less than 125 mils.

11. The computer system, as set forth in claim 1, wherein the combined thickness of each of the plurality of card extractors and the respective one of the plurality of dividers is less than or equal to 100 mils.

12. The computer system, as set forth in claim 1, wherein each of the plurality of card extractors is coupled to one of the respective dividers such that the surface of the extractor and the surface of the divider are in contact with one another.

13. The computer system, as set forth in claim 12, wherein the card extractor is configured to slide along the surface of the divider.

14. The computer system, as set forth in claim 1, wherein the gripping portion of the card extractor comprises a finger hole.

15. The computer system, as set forth in claim 1, wherein each of the plurality of dividers comprises a recessed area wherein the respective card extractor is disposed such that the surface of the card extractor is in slideable contact with the surface of the divider.

16. The computer system, as set forth in claim 1, wherein no part of the gripping portion of the card extractor overhangs any portion of a respective daughter card.

17. The computer system, as set forth in claim 1, wherein each of the plurality of card extractors is coupled to the respective one of the plurality of dividers via one or more sliding snaps.

18. A circuit board holding system comprising:
a base portion comprising a plurality of slots through which a plurality of circuit boards may be coupled to a motherboard;
a plurality of dividers coupled to the base portion such that each of the plurality of dividers is perpendicular to the base portion and configured to separate each of the plurality of circuit boards; and
a plurality of extraction mechanisms, wherein each of the plurality of extraction mechanisms is coupled to a respective divider and wherein each of the plurality of extraction mechanisms is configured to decouple a respective one of the plurality of circuit boards from the motherboard without moving the respective divider in a direction perpendicular to the base portion.

19. The circuit board holding system, as set forth in claim 18, wherein each of the plurality of extraction mechanisms comprises:
a gripping portion configured to be pulled to facilitate the decoupling of the circuit board from the motherboard; and
a lip portion extending from the surface of the card extractor and arranged below an edge of the respective circuit board such that when the gripping portion is pulled, the circuit board is lifted from the respective connector on the motherboard.

20. The circuit board holding system, as set forth in claim 18, wherein each of the plurality of dividers is coupled to the base portion in a direction that is perpendicular to the surface of the base portion.

21. The circuit board holding system, as set forth in claim 18, wherein the distance between each of the plurality of dividers is in the range of 890 mils–910 mils.

22. The computer system, as set forth in claim 18, wherein the distance between each of the plurality of dividers is in the range of 780 mils–1020 mils.

23. The computer system, as set forth in claim 18, wherein the thickness of each of the plurality of dividers is less than 110 mils.

24. The computer system, as set forth in claim 18, wherein the thickness of each of the plurality of dividers is less than or equal to 100 mils.

25. The computer system, as set forth in claim 18, wherein the combined thickness of each of the plurality of extraction mechanisms and the respective one of the plurality of dividers is less than 125 mils.

26. The computer system, as set forth in claim 18, wherein the combined thickness of each of the plurality of extraction mechanisms and the respective one of the plurality of dividers is less than or equal to 100 mils.

27. The computer system, as set forth in claim 18, wherein each of the plurality of extraction mechanisms is coupled to one of the respective dividers such that the surface of the extractor and the surface of the divider are in contact with one another.

28. The computer system, as set forth in claim 18, wherein the extraction mechanism is frictionally slideable along the surface of the divider.

29. The computer system, as set forth in claim 18, wherein each of the plurality of dividers comprises a recessed area wherein the respective extraction mechanism is disposed such that the surface of the extraction mechanism is configured to slide along the surface of the divider.

30. The computer system, as set forth in claim 18, wherein each of the plurality of card extraction mechanisms is coupled to the respective one of the plurality of dividers via one or more sliding snaps.

31. The computer system, as set forth in claim 19, wherein the gripping portion of the extraction mechanism comprises a finger hole.

32. The computer system, as set forth in claim 19, wherein no part of the gripping portion of the extraction mechanism overhangs any portion of a respective circuit board.

33. A method of manufacturing a circuit board holding system comprising the acts of:

providing a base portion configured to hold a plurality of circuit boards in a perpendicular fashion with respect to the surface of the base portion via a holding mechanism;

coupling a plurality of dividers to the base portion in a perpendicular fashion with respect to the surface of the base portion and arranged such that each of the plurality of dividers is positioned directly adjacent to at least one of the holding mechanisms on the base portion; and coupling each of a plurality of extraction mechanisms to a respective divider such that the extraction mechanism is slideably attached to the respective divider and configured to lift a respective one of the plurality of circuit boards from the holding mechanism on the base portion.

34. The method of manufacturing, as set forth in claim 33, wherein the act of coupling each of a plurality of extraction mechanisms comprises the acts of:

providing a gripping portion for each of the extraction mechanisms configured to be pulled to facilitate the lifting of the respective one of the plurality of circuit boards from the holding mechanism on the base portion; and providing a lip portion extending from the surface of the extraction mechanism and arranged below an edge of the respective one of the plurality of circuit boards such that when the gripping portion is pulled, the circuit board is lifted from the holding mechanism on the base portion.

35. The method of manufacturing, as set forth in claim 33, wherein the act of coupling the plurality of dividers comprises the act of coupling each of the plurality of dividers to the base portion at a distance of at least 890 mils–910 mils with respect to one another.

36. The method of manufacturing, as set forth in claim 33, wherein the act of coupling the plurality of dividers comprises the act of coupling each of the plurality of dividers to the base portion at a distance of at least 780 mils–1020 mils with respect to one another.

37. The method of manufacturing, as set forth in claim 33, wherein the act of coupling the plurality of dividers comprises the act of coupling a plurality of dividers to the base portion, each of the plurality of dividers comprising a thickness less than or equal to 100 mils.

38. The method of manufacturing, as set forth in claim 33, wherein the act of coupling the plurality of dividers comprises the act of coupling a plurality of dividers to the base portion, each of the plurality of dividers comprising a thickness less than 125 mils.

39. The method of manufacturing, as set forth in claim a33, wherein the act of providing a gripping portion comprises the act of providing a finger hole.

40. The method of manufacturing, as set forth in claim 33, wherein the act of coupling the plurality of dividers comprises the act of providing a plurality of dividers, each of the plurality of dividers having a recessed area.

41. The method of manufacturing, as set forth in claim 40, wherein the act of coupling each of the plurality of extraction mechanisms comprises the act of disposing the extraction mechanism in the recessed area of the divider such that the surface of the extraction mechanism is in slideable contact with the surface of the divider.

42. The method of manufacturing, as set forth in claim 34, wherein the act of providing a gripping portion comprises the act of providing a gripping portion wherein no part of the gripping portion overhangs any portion of a respective holding mechanism.

43. The method of manufacturing, as set forth in claim 33, wherein the act of coupling each of the plurality of extraction mechanisms to a respective divider comprises the act of coupling each of the plurality of extraction mechanisms to a respective divider via one or more sliding snaps.

44. The method of manufacturing, as set forth in claim 33, comprising the act of inserting the base portion into a computer system chassis.

* * * * *